US009966928B2

(12) United States Patent
Rijssemus

(10) Patent No.: US 9,966,928 B2
(45) Date of Patent: May 8, 2018

(54) MULTI-PORT CATV POWER SPLITTER WITH INCREASED BANDWIDTH

(71) Applicant: Technetix B.V., Veenendaal (NL)

(72) Inventor: Martien Rijssemus, Em Heelsum (NL)

(73) Assignee: Technetix B.V., Veenendaal (NL)

( * ) Notice: Subject to any disclaimer, the term of this patent is extended or adjusted under 35 U.S.C. 154(b) by 0 days. days.

(21) Appl. No.: 15/070,330

(22) Filed: Mar. 15, 2016

(65) Prior Publication Data

US 2016/0315597 A1 Oct. 27, 2016

(30) Foreign Application Priority Data

Apr. 24, 2015 (GB) .................................. 1506991.7

(51) Int. Cl.
*H03H 7/48* (2006.01)
*H04N 7/10* (2006.01)

(52) U.S. Cl.
CPC .............. *H03H 7/48* (2013.01); *H04N 7/104* (2013.01)

(58) Field of Classification Search
CPC ................................. H03H 7/48; H04N 7/104
USPC ......................................................... 333/100
See application file for complete search history.

(56) References Cited

U.S. PATENT DOCUMENTS 2,916,672 A * 12/1959 Segall ....................... F02P 7/03
                                                      123/634
6,118,354 A    9/2000 Decramer et al.
7,755,452 B2 *  7/2010 Knickerbocker ......... H01P 5/16
                                                      330/124 R
8,810,334 B2 *  8/2014 Rijssemus .............. H03H 7/482
                                                      333/131
9,209,774 B2 * 12/2015 Rijssemus ................ H03H 7/42
2013/0181789 A1  7/2013 Rijssemus

FOREIGN PATENT DOCUMENTS

DE    3435605 A1   4/1986
JP    0669825 A    3/1994

OTHER PUBLICATIONS

United Kingdom Intellectual Property Office, Patents Act 1977: Search Report under Section 17, Application No. GB1603749.1, dated Jun. 13, 2016 (1 page).
Espacenet, English Machine Translation of Abstract for DE3435605A1, published Apr. 17, 1986, retrieved from http://worldwide.espacenet.com on Mar. 9, 2016 (2 pages).
Espacenet, English Machine Translation of Abstract for JHP0669825A, published Mar. 11, 1994, retrieved from http://worldwide.espacenet.com on Mar. 9, 2016 (2 pages).
United Kingdom Intellectual Property Office, Patents Act 1977: Search Report under Section 17, Application No. GB1506991.7, dated Oct. 15, 2015 (1 page).

* cited by examiner

Primary Examiner — Robert J Pascal
Assistant Examiner — Kimberly Glenn
(74) Attorney, Agent, or Firm — Wood Herron & Evans LLP

(57) ABSTRACT

There is provided a signal splitter comprising at least four outputs and a plurality of step-up transformers, wherein each step-up transformer has less than seven turns. A first step-up transformer is connected to a common port and positioned between the input and second and third step-up transformers. The first step-up transformer has a different number of turns to the second and third step-up transformers.

12 Claims, 5 Drawing Sheets

MULTI-PORT CATV POWER SPLITTER WITH INCREASED BANDWIDTH

CROSS-REFERENCE TO RELATED APPLICATION

The present application claims priority under 35 U.S.C. § 119 of United Kingdom Patent Application No. 1506991.7, filed Apr. 24, 2015, the disclosure of which is hereby incorporated herein by reference in its entirety.

FIELD OF THE INVENTION

The present invention relates to a multi-port power splitter for use in cable television (CATV) networks where frequencies from 5 MHz (or 10 MHz) up to 2 GHz are used.

BACKGROUND OF THE INVENTION

Known power splitters are designed to operate from frequencies of 5 MHz up to around 1200 MHz. However, their performance is restricted due to the ferrite core transformers used, particularly due to the losses caused by step-up transformers in the splitters.

With ever more use of Internet signal protocols and the Internet, cable networks need to provide more signal bandwidth. While present networks use frequencies from 5 up to 1000 MHz, new standards require the availability of more bandwidth, with frequencies up to 1700 MHz likely to be required. While coaxial cable used to transport signals can accommodate this bandwidth, power splitters cannot perform adequately with the increased bandwidth and only provide a reasonable performance up to 1200 MHz.

SUMMARY OF THE INVENTION

In accordance with the present invention, there is provided a signal splitter comprising at least four outputs and a plurality of step-up transformers, wherein each step-up transformer has less than seven turns. By using step-up transformers with fewer turns than the conventional seven turn transformers used in splitters, the bandwidth of the splitter is substantially increased so that the splitter can function for signals of up to at least 2 GHz.

Preferably, a first step-up transformer is connected to an input and positioned between the input and second and third step-up transformers, the first step-up transformer having a different number of turns to the second and third step-up transformers. Using step-up transformers with different numbers of turns, and so different turn ratios, allows adjustments to impedance within the splitter.

The first step-up transformer is preferably connected to a transmission line transformer to provide separate signal paths to connect respectively to second and third step-up transformers. Typically, a transmission line transformer is disposed between each first step-up transformer and the second and third step-up transformers, the transmission line transformer providing separate inputs to connect to each of the second and third step-up transformer.

One or each transmission line transformer may be wound on a common core with a step-up transformer.

The input may be a common port for receiving signals from a headend or may be a signal path from a transmission line transformer.

Preferably, a first impedance on a downstream side of the second and third step-up transformers is different to a second impedance on the upstream side of the second and third step-up transformers. The first impedance and the second impedance are both preferably in the range 30-100Ω.

Such a 4-way splitter typically provides bidirectional signal paths for downstream signals passing from a headend associated with a network provider down to customer devices and upstream signals returning to the headend from customer devices. Multiple 4-way splitters can be combined to provide 8-way splitters, 12-way splitters and so on.

Capacitive and resistive elements may be associated with the plurality of step-up transformers and selected to produce an impedance of substantially 75Ω at the input and each output.

Each transformer is preferably associated with a ferrite core, the total number of ferrite cores being half the total number of transformers, such that each ferrite core is associated with two transformers. Thus, the total number of ferrite cores is preferably half the combined number of step-up transformers and transmission line transformers.

BRIEF DESCRIPTION OF THE DRAWINGS

The present invention will now be described by way of example and with reference to the accompanying drawings in which.

DETAILED DESCRIPTION OF THE INVENTION

Figure 1:
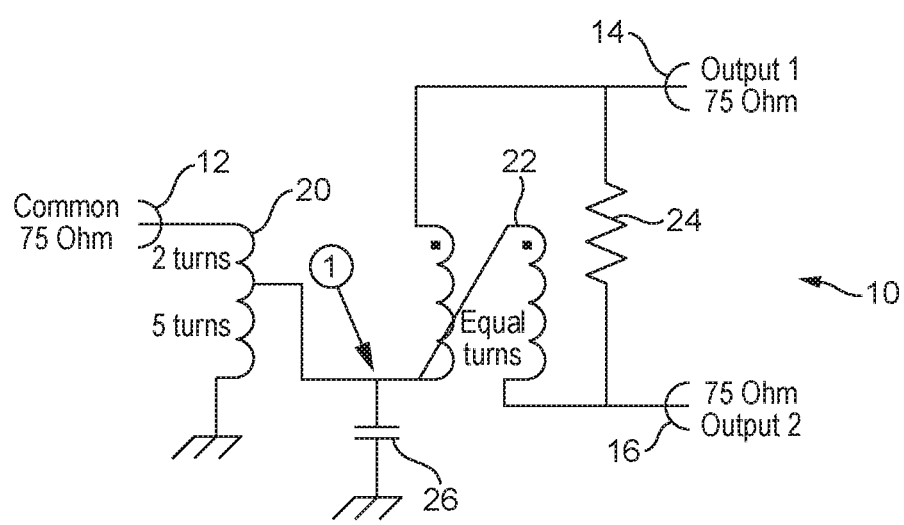
FIG. 1 shows a schematic diagram of a prior art 2-way splitter.

A prior art standard 2-way splitter 10 is shown in FIG. 1. Splitter 10 comprises a common input port 12 connected to two output ports using a step-up transformer 20, with a turn ratio of 5+2 turns wound on a ferrite core, connected to a transmission line transformer 22 with equal turns, usually one or two turns, also wound on a ferrite core. Transformer 22 is known in the art as a "fork" as it splits the signal path and is sometimes referred to as a "BALUN". The impedance of the output ports 14, 16 is set to 75Ω and the impedance at common port 12 is required to match this as closely as possible. Resistor 24 of value approximately 150Ω is connected between outputs 14 and 16 so as to be in parallel with the outputs and capacitor 26 of value approximately 2 pF forms a low pass filter, as described below. Values of resistor 24 and capacitor 26 depend on the circuit.

The impedance at point 1 is 37.5Ω because of the equal turn ratio of transmission line transformer 22. The impedance Z at common port 12, will be:

$$Z = \left(\frac{5+2}{5}\right)^2 \times 37.5 = 73.5 \text{ }\Omega$$

This value is close to the required impedance of 75Ω at common port 12. The result is a good impedance match at all ports 12, 14, 16 as well as a good isolation and insertion loss.

Capacitor 26 acts as a compensator for series inductances present in the circuit. These series inductances are mostly leakage inductances from the transformers and only partly caused by the printed circuit board tracks of the circuit. The combination of series inductances with capacitance 26 forms a low pass filter thus limiting the upper frequency range to around 1200 MHz but at the same time improving the performance at lower frequencies less than 1200 MHz by compensating the series inductances.

Due to the existence of the series inductance, it is preferred that impedances in the splitter do not become too low, i.e., less than 30Ω, as then the series inductances would become dominant. At the same time, the impedance should not be too high, i.e., not greater than 100Ω, because of the existence of stray capacitance and the inter-winding capacitance becoming too dominant.

The main limitation for a good performance at frequencies above 1200 MHz in the described circuit is the step-up transformer where the leakage inductance and inter-winding capacitance are relatively large.

Figure 2:
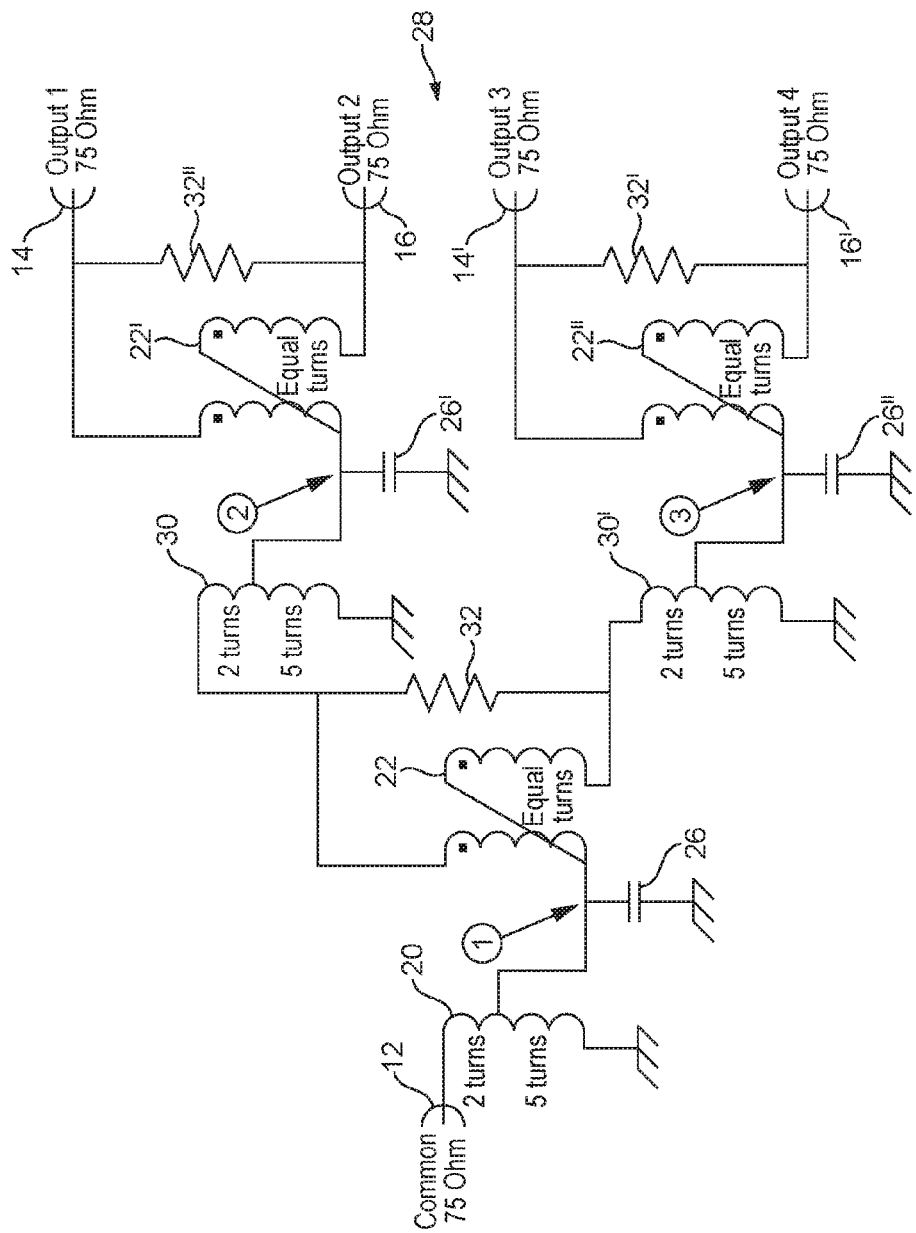
FIG. 2 shows a schematic diagram of a prior art 4-way splitter.

Multi-port splitters with an even number of outputs are made by placing several 2-way splitters in series, see FIG. 2 for an example of a standard 4-way splitter. An 8-way splitter is made by placing two 4-way splitters in series with the outputs of a 2-way splitter. The splitters are bi-directional, acting to split signals passing downstream from a common input port to a plurality of outputs and for upstream signals, combining signals from a plurality of outputs into one combined signal for transmission from the common input port to a headend associated with a signal provider.

In FIG. 2, three 2-way splitters are used to produce a 4-way splitter 28 with common port 12, four output ports 14, 14", 16, 16", step-up transformers 20, 30, 30' and transmission line transformers 22, 22', 22". Capacitors 26, 26', 26" are used to provide low pass filters, with resistors 32, 32', 32" selected according to the circuit characteristics. The impedance at point 2 and 3 is again 37.5Ω and this impedance is transformed to 75Ω by step-up transformers 30, 30' using a 5+2 turn ratio with a total of 7 turns. At point 1, the impedance is again 37.5Ω and again this impedance is transformed by step-up transformer 20 to be 75Ω at common port 12.

Good performance for frequencies above 1200 MHz becomes difficult as there are two 2-way splitters in series for every output port. For an 8-way splitter, there are three 2-way splitters in series for every output port making good performance at frequencies above 1200 MHz even more difficult. A multi-port power splitter used in such a network requires high return loss, low insertion loss and high isolation between output ports over the full frequency range, especially since the losses in the cable increase with frequency.

For a good performance at frequencies above 1200 MHz, step-up transformers 20, 30 and 30' need to be improved.

Figure 3:
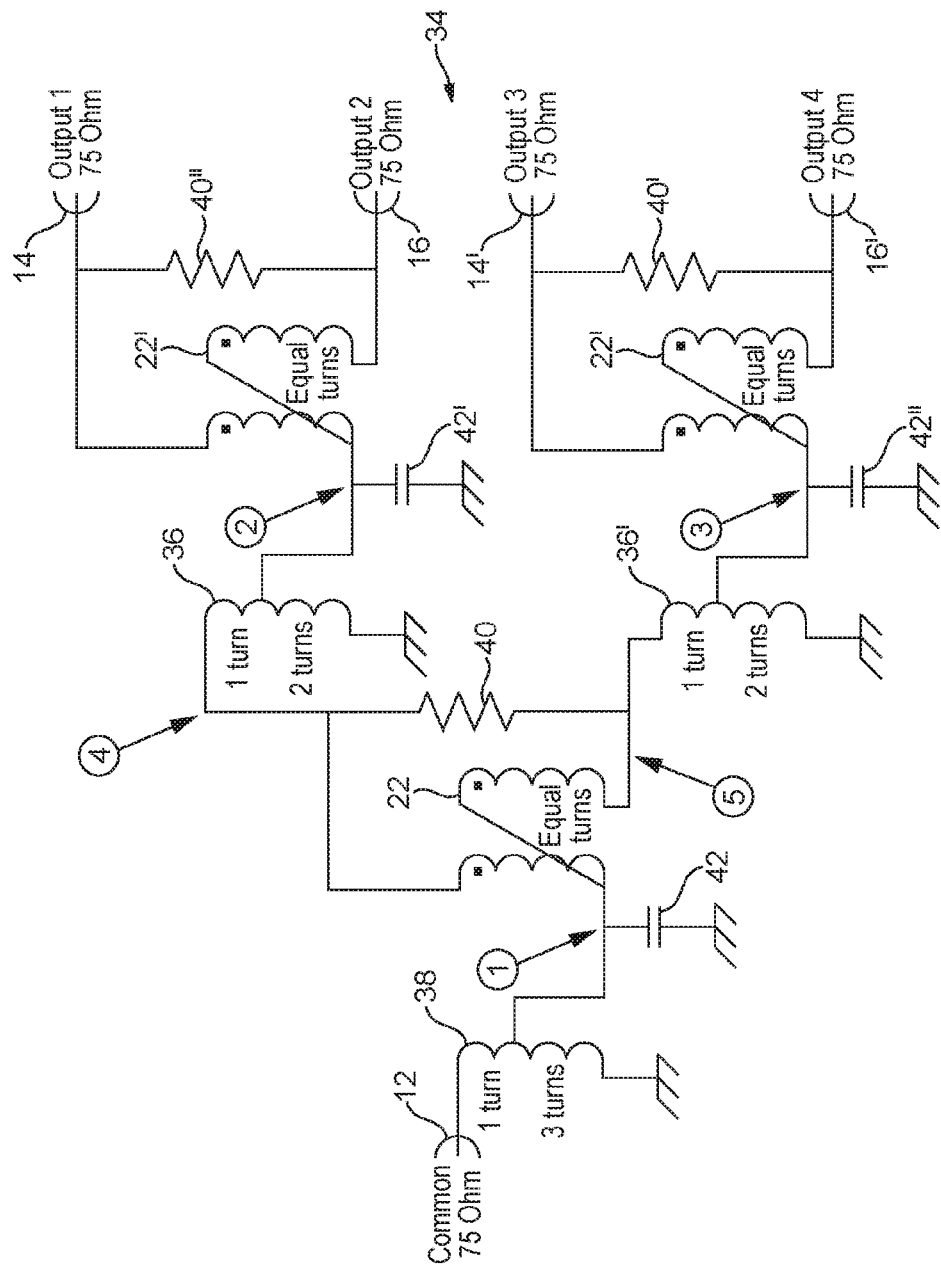
FIG. 3 shows a schematic diagram of a 4-way splitter in accordance with the present invention.

FIG. 3 shows an illustrative example of a 4-way splitter 34 in accordance with the present invention. Instead of identical step-up transformers all having a 5+2 turn ratio and seven turns, step-up transformers with fewer turns are used with different combinations of total turns. The impedance of common port 12 and output ports 14, 16, 14", 16" is required to remain at 75Ω. Step-up transformers 36, 36" in communication with output ports 14, 16, 14", 16" via transmission line transformers 22", 22''' are selected to have a turn ratio of 2+1 with a total number of three turns. The impedance at points 2 and 3 between each step-up transformer 36, 36" and the corresponding transmission line transformer is again 37.5Ω.

Instead of transforming this to 75Ω at point 4 and point 5, step-up transformers 36 and 36" transform this impedance to:

$$Z = \left(\frac{2+1}{2}\right)^2 \times 37.5 = 84 \, \Omega$$

This impedance is within the preferred impedance range of 30 to 100Ω while step-up transformers 36, 36' have a greatly increased bandwidth because of the much lower total turns, three instead of seven.

The impedance of 84Ω at point 4 and point 5 is transformed to 42Ω at point 1 by transmission line transformer 22 with an equal turn ratio. This 42Ω impedance is then transformed by step-up transformer 38 with a turn ratio 3+1 and a total number of four turns. Using the well-known equation the impedance at common port 12 is therefore:

$$Z = \left(\frac{3+1}{3}\right)^2 \times 42 = 74.7 \, \Omega$$

This is a very good impedance match. Transformer 38 has an increased bandwidth because the total number of turns is now four instead of seven.

By transforming to different impedances within the 30 to 100Ω range, step-up transformers with fewer turns can be used to provide increased bandwidth and allow the splitter to function well at frequencies up to at least 2 GHz. Using step-up transformers with differing numbers of turns through the splitter circuit, rather than identical step-up transformers, and keeping within the 30 to 100Ω range enables great improvements in bandwidth whilst ensuring the impedance at the common port and the output ports remains as 75Ω.

For the circuit of FIG. 3, resistor 40 is approximately 180Ω instead of 150Ω. Capacitors 42, 42' and 42" can be considerably lower in value than for the prior art splitter of FIG. 2 as transformers 36, 36' and 38 have a much lower leakage inductance and inter-winding capacity because of the lower number of total turns. Resistors 40', 40" are used to ensure good isolation between the output ports.

The result is a 4-way splitter with very good 75Ω impedance on the common and output ports but with a much better performance at frequencies above 1200 MHz up to 2 GHz because of the reduced number of turns of the step-up transformers 36, 36', 38 and their different turn ratios.

Figure 4:
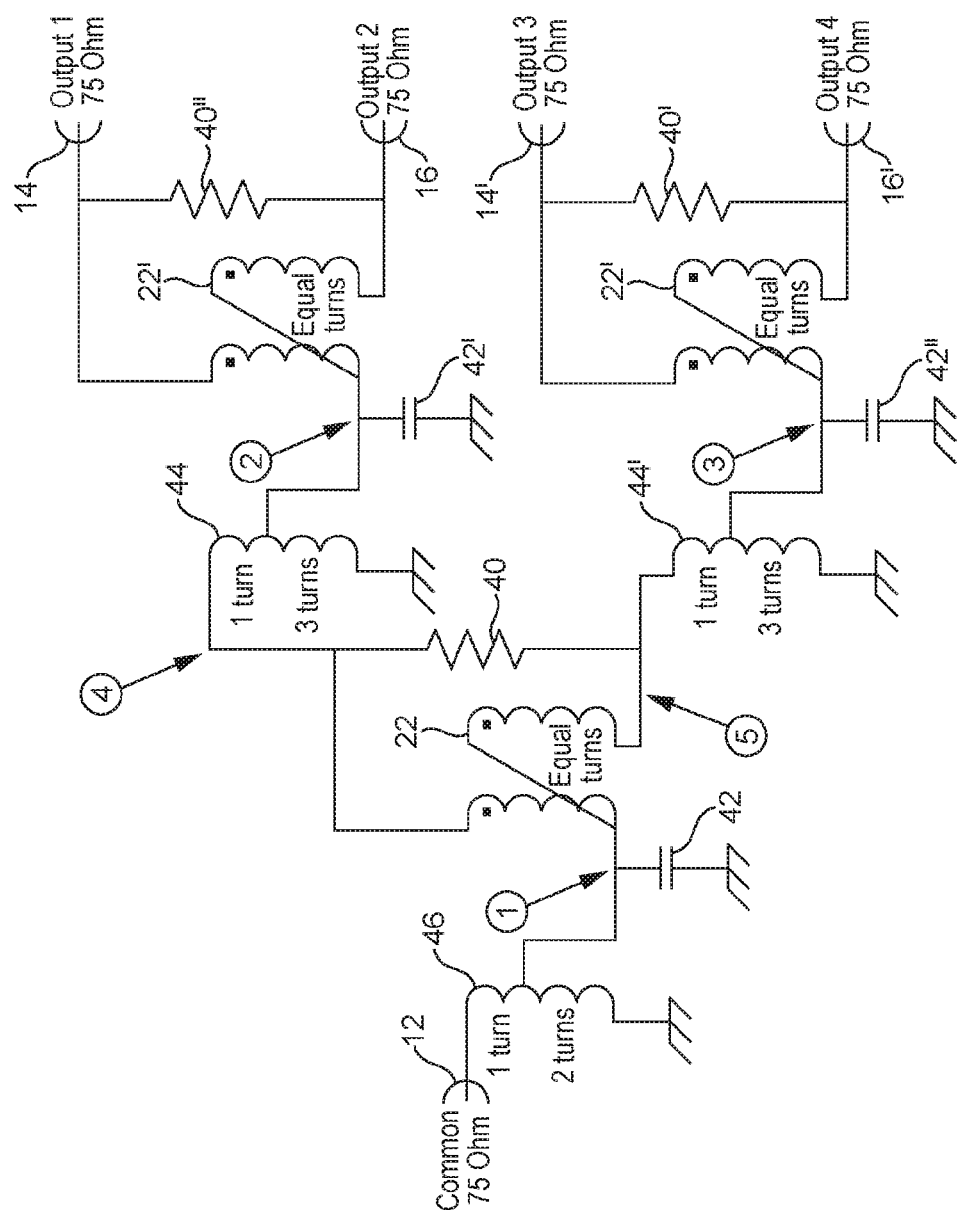
FIG. 4 shows a schematic diagram of an alternate embodiment of a 4-way splitter.

Another preferred turn ratio of the step-up transformers is shown in FIG. 4 where step-up transformers 44, 44' associated with output ports 14, 16, 14', 16' have a turn ratio of 3+1 with a total of four turns and step-up transformer 46 connected to common port 12 has a turn ratio of 2+1 with a total of three turns. The impedance at point 4 and point 5 is:

$$Z = \left(\frac{3+1}{3}\right)^2 \times 37.5 = 66.6 \, \Omega$$

And the impedance at common port 12 becomes:

$$Z = \left(\frac{2+1}{2}\right)^2 \times 33.3 = 74.9 \, \Omega$$

Resistor 40 is approximately 130Ω.

Again, the result is a 4-way splitter with very good 75Ω impedance on the common and the output ports but with a much better performance at frequencies above 1200 MHz because of the different turn ratios of the step-up transformers.

Figure 5:
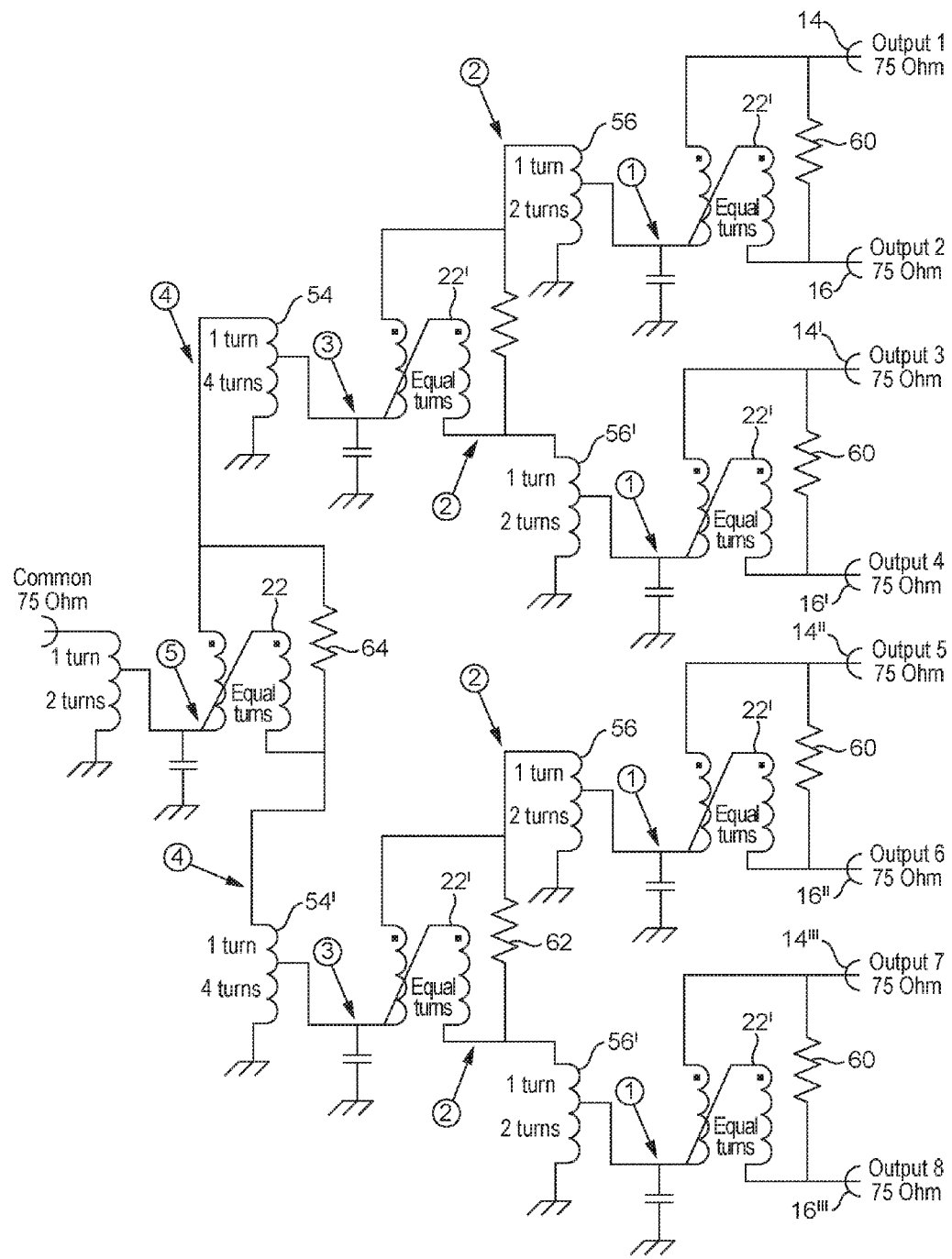
FIG. 5 shows a schematic diagram of an embodiment of an 8-way splitter.

An 8-way splitter 50 with increased bandwidth can be constructed by placing two 4-way splitters with increased bandwidth in series with the output ports of a modified 2-way splitter, see FIG. 5 where step-up transformers with three and five turns are used.

In FIG. 5, a first step-up transformer 52 is connected between common port 12 and transmission line transformer 22 to split the signal into two paths. Each signal path connects to a single step-up transformer 54, 54' having a total of five turns in a 4+1 turn ratio and then to another transmission line transformer 22'. Transmission line transformer 22' splits the signal path again, with each path individually connecting to a single step-up transformer 56, 56' having a total of three turns in a turn ratio 2+1. Each step-up transformer 56, 56' is connected to a further transmission line transformer 22'' which again splits the signal path to connect to two separated outputs 14, 16, 14', 16', 14'', 16'', 14''', 16''' connected to consumer equipment or other network devices. The splitter thus splits an incoming signal into eight separate paths to supply eight separate outputs.

Again, the impedance at the points marked "1" is 37.5Ω. This impedance is transformed at the point marked "2" by step-up transformer marked 56 as described before to:

$$Z = \left(\frac{2+1}{2}\right)^2 \times 37.5 = 84 \ \Omega$$

As described before, the impedance at the points marked "3" is 42Ω.

Step-up transformers 54 transform this 42Ω at the points marked "4" to an impedance of:

$$Z = \left(\frac{4+1}{4}\right)^2 \times 42 = 65.6 \ \Omega$$

The impedance at point 5 will be 32.8Ω. This impedance is finally transformed by step-up transformer 52 connected to common port 12 to:

$$Z = \left(\frac{2+1}{2}\right)^2 \times 32.8 = 73.8 \ \Omega$$

This value is close to 75Ω and will give a good impedance match. Resistors 60 are approximately 150Ω. Resistors 62 are approximately 180Ω. Finally, resistor 64 is approximately 130Ω.

In the configurations shown in FIGS. 3 to 5, a transmission line transformer can be wound on a common ferrite core with a step-up transformer. If desired, pairs of transformers can be wound onto ferrite cores so that the total number of ferrite cores is half the total number of transformers, and thus half the combined number of step-up transformers and transmission line transformers.

Since all step-up transformers have a lower total number of turns than standard step-up transformers which have seven turns, the performance at frequencies above 1200 MHz is much improved over a standard 8-way splitter. By using an innovative way of using different turn ratios in the step-up transformers, bandwidth is increased while maintaining a good match to 75Ω impedance.

While the present invention has been illustrated by description of various embodiments and while those embodiments have been described in considerable detail, it is not the intention of Applicant to restrict or in any way limit the scope of the appended claims to such details. Additional advantages and modifications will readily appear to those skilled in the art. The present invention in its broader aspects is therefore not limited to the specific details and illustrative examples shown and described. Accordingly, departures may be made from such details without departing from the spirit or scope of Applicant's invention.

What is claimed is:

1. A signal splitter comprising at least four outputs and a plurality of step-up transformers, wherein each step-up transformer has less than seven turns, wherein the plurality of step-up transformers comprises a first step-up transformer connected to an input and positioned between the input and second and third step-up transformers, the first step-up transformer having a different number of turns relative to the second and third step-up transformers.

2. The signal splitter according to claim 1, wherein the first step-up transformer is connected to a transmission line transformer to provide separate signal paths to connect respectively to the second and third step-up transformers.

3. The signal splitter according to claim 2, wherein the transmission line transformer is wound on a common core with a step-up transformer of the plurality of step-up transformers.

4. The signal splitter according to claim 1, wherein a transmission line transformer is disposed between each first step-up transformer and the second and third step-up transformers, the transmission line transformer providing separate inputs to connect to each of the second and third step-up transformers.

5. The signal splitter according to claim 1, wherein the input is a common port.

6. The signal splitter according to claim 1, wherein the input is a signal path from a transmission line transformer.

7. The signal splitter according to claim 1, wherein a first impedance on a downstream side of the second and third step-up transformers is different to a second impedance on an upstream side of the second and third step-up transformers.

8. The signal splitter according to claim 7, wherein the first impedance and the second impedance are both in the range 30-100Ω.

9. The signal splitter according to claim 1 being bidirectional and configured for both upstream and downstream signals.

10. The signal splitter according to claim 1, wherein capacitive and resistive elements are associated with the plurality of step-up transformers and are selected to produce an impedance of substantially 75Ω at an input of the signal splitter.

11. The signal splitter according to claim 1, wherein each of the plurality of step-up transformers is associated with a ferrite core and the total number of ferrite cores is half the total number of the transformers.

12. The signal splitter according to claim 11, wherein the total number of ferrite cores is half the combined number of step-up transformers and transmission line transformers.

* * * * *